(12) United States Patent
Mu et al.

(10) Patent No.: US 10,833,803 B2
(45) Date of Patent: Nov. 10, 2020

(54) LOW DENSITY PARITY CHECK CODE TRANSMISSION METHOD AND DEVICE

(71) Applicant: China Academy of Telecommunications Technology, Beijing (CN)

(72) Inventors: Xijin Mu, Beijing (CN); Jiaqing Wang, Beijing (CN); Baoming Bai, Beijing (CN); Shaohui Sun, Beijing (CN)

(73) Assignee: China Academy of Telecommunications Technology, Beijing (CN)

( * ) Notice: Subject to any disclaimer, the term of this patent is extended or adjusted under 35 U.S.C. 154(b) by 0 days.

(21) Appl. No.: 16/345,626

(22) PCT Filed: Oct. 27, 2017

(86) PCT No.: PCT/CN2017/108005
§ 371 (c)(1),
(2) Date: Apr. 26, 2019

(87) PCT Pub. No.: WO2018/077233
PCT Pub. Date: May 3, 2018

(65) Prior Publication Data
US 2019/0280810 A1    Sep. 12, 2019

(30) Foreign Application Priority Data

Oct. 27, 2016  (CN) .......................... 2016 1 0959949
Jan. 9, 2017   (CN) .......................... 2017 1 0015031

(51) Int. Cl.
*H04L 1/00*     (2006.01)
*H03M 13/11*    (2006.01)
(Continued)

(52) U.S. Cl.
CPC ....... *H04L 1/0041* (2013.01); *H03M 13/1102* (2013.01); *H04L 1/0045* (2013.01);
(Continued)

(58) Field of Classification Search
CPC . H04L 1/0041; H04L 1/0068; H04L 27/2627; H04L 1/0057; H04L 1/0009;
(Continued)

(56) References Cited

U.S. PATENT DOCUMENTS

2010/0115359 A1* 5/2010 Chung ............... H03M 13/1102
                                                      714/748
2010/0251061 A1* 9/2010 Okamura ........... H03M 13/1102
                                                      714/752

(Continued)

FOREIGN PATENT DOCUMENTS

| CN | 101150378 A    | 3/2008  |
|----|----------------|---------|
| EP | 2 525 496 A1   | 11/2012 |
| WO | WO2015/178694 A1 | 11/2015 |

OTHER PUBLICATIONS

Samsung, "Flexibility of LDPC—Length, Rate and I R-HARQ," 3GPP TSG-RAN WG1 #85, R1-164007, Nanjing, China, May 23-27, 2016.

*Primary Examiner* — Cynthia Britt
*Assistant Examiner* — Sazzad Hossain
(74) *Attorney, Agent, or Firm* — Foley & Lardner LLP

(57) ABSTRACT

A low density parity check code transmission method and device, for use in improving the anti-burst-error capability of a low density parity check code. The method provided by the present application comprises: an interleaver changes the sequence of bit streams of a low density parity check code according to a preset rule, and outputs to a modulator the low density parity check code the sequence of bit streams of which is changed; the modulator modulates the low density parity check code the sequence of bit streams of which is (Continued)

changed and then sends the modulated low density parity check code to a receive end by using a channel.

16 Claims, 6 Drawing Sheets

(51) Int. Cl.
    *H03M 13/29*     (2006.01)
    *H03M 13/25*     (2006.01)
    *H04L 27/26*     (2006.01)

(52) U.S. Cl.
    CPC .......... *H04L 1/0057* (2013.01); *H04L 1/0058* (2013.01); *H04L 1/0068* (2013.01); *H04L 1/0071* (2013.01); *H03M 13/255* (2013.01); *H03M 13/2906* (2013.01); *H04L 1/0009* (2013.01); *H04L 27/2627* (2013.01)

(58) Field of Classification Search
    CPC ... H04L 1/0045; H04L 1/0058; H04L 1/0071; H03M 13/2906; H03M 13/255; H03M 13/005; H03M 13/1102
    See application file for complete search history.

(56) References Cited

U.S. PATENT DOCUMENTS

| | | | |
|---|---|---|---|
| 2015/0082131 A1* | 3/2015 | Jeong | .................... H04L 1/0057 714/776 |
| 2015/0341054 A1 | 11/2015 | Myung et al. | |
| 2016/0248446 A1 | 8/2016 | Kim et al. | |

* cited by examiner

LOW DENSITY PARITY CHECK CODE TRANSMISSION METHOD AND DEVICE

This application is a National Stage of International Application No. PCT/CN2017/108005, filed Oct. 27, 2017, which claims priority to Chinese Patent Application No. 201610959949.3, filed Oct. 27, 2016, and Chinese Patent Application No. 201710015031.8, filed Jan. 9, 2017, both of which are hereby incorporated by reference in their entireties.

FIELD

The present application relates to the field of communications, and particularly to a method and apparatus for transmitting low-density parity check codes.

BACKGROUND

As the 4G technologies have been widely commercialized, future $5^{th}$-Generation (5G) mobile communication has been extensively researched and developed throughout the world. Channel encoding parameters in an Enhanced Mobile Broadband (eMBB) scenario in 5G mobile communication are defined as follows in the existing $3^{rd}$ Generation Partnership Project (3GPP).

TABLE 1

| Channel encoding parameters in the eMBB scenario | |
|---|---|
| Code rate | 1/5, 1/3, 2/5, 1/2, 2/3, 3/4, 5/6, 8/9 |
| Length of information bits | 100, 400, 1000, 2000, 4000, 6000, 8000 Optional (12K, 16K, 32K, 64K) |

The incremental and redundant Low Density Parity Check (LDPC) codes have been intensively discussed and researched in the 3GPP standardization meetings as one of 5G candidate codes due to their excellent performance, wide coverage ranges of code lengths and of code rates, a high multiplexing factor, easiness to implement in hardware, the possibility to be encoded directly using a check matrix, and other advantages.

In a solution, a check matrix of the incremental and redundant LDPC codes is structured as illustrated in FIG. 1. The entire matrix includes a circulant permutation small matrix $\boxed{P}$ and a unit matrix $\boxed{I}$, where the highest code rate component (the highest code-rate component R1 as illustrated in FIG. 1) includes Quasi-Cyclic Irregular Repeat-Accumulate (QC-IRA) LDPC codes in a dually-diagonal structure. Parity check bits are added incrementally and redundantly based upon the QC-IRA LDPC codes with the highest code rate to thereby determine LDPC codes with lower code rate (the lower code-rate components R2, R3, R4, and R5 as illustrated in FIG. 1).

A solution to transmitting incremental and redundant LDPC codes is as illustrated in FIG. 2, where an information sequence input to an incremental and redundant LDPC encoder is encoded by the incremental and redundant LDPC encoder, so LDPC codewords are output, and then the LDPC codewords are modulated, transmitted over a channel, and demodulated, and a demodulation result is decoded by an incremental and redundant LDPC decoder, so a decoding result is output.

As can be apparent from the structure above of the check matrix of the incremental and redundant LDPC codes, the codes are system codes, so the information bits thereof are separate from the parity check bits thereof. This structure is susceptible and not robust to a burst of errors (for example, a plurality of symbols are fading consecutively over a fading channel).

SUMMARY

Embodiments of the application provide a method and apparatus for transmitting a low-density parity check codes so as to improve the robustness to a burst of errors while LDPC codes are being transmitted.

An embodiment of the application provides a method for transmitting LDPC codes, the method including: changing, by an interleaver, a bit stream order of LDPC codes according to a preset rule, and outputting the LDPC codes in the changed bit stream order to a modulator; and modulating, by the modulator, the LDPC codes in the changed bit stream order, and then transmitting them to a receiver over a channel.

With this method, the interleaver changes the bit stream order of the LDPC codes according to the preset rule, and outputs the LDPC codes in the changed bit stream order to the modulator; and the modulator modulates the LDPC codes in the changed bit stream order, and then transmits them to the receiver over the channel, thus lowering the probability of a burst of errors in a consecutive bit stream while the LDPC codes are being transmitted, so as to improve the robustness to a burst of errors while the LDPC codes are being transmitted.

Optionally before changing, by the interleaver, the bit stream order of the LDPC codes according to the preset rule, and outputting the LDPC codes in the changed bit stream order to the modulator, the method further includes: encoding, by an encoder, the LDPC codes, and outputting the encoded LDPC codes to the interleaver; and changing, by the interleaver, the bit stream order of the LDPC codes according to the preset rule, and outputting the LDPC codes in the changed bit stream order to the modulator includes: changing, by the interleaver, the bit stream order of the encoded LDPC codes according to the preset rule, and outputting the LDPC codes in the changed bit stream order to the modulator.

Optionally the LDPC codes are incremental and redundant LDPC codes.

Optionally the interleaver includes N/C rows of block interleavers, and each row includes C columns of block interleavers, where N is the total number of codewords among the LDPC codes, the LDPC codes includes N/C groups of codewords, and each group of codewords includes C bit codewords; and the changing, by the interleaver, the bit stream order of the LDPC codes according to the preset rule, and outputting the LDPC codes in the changed bit stream order to the modulator includes: receiving, by the interleaver, the respective groups of codewords in the LDPC codes in sequence in an order of the rows, outputting the codewords in sequence in an order of the columns, and obtaining and outputting the LDPC codes in the changed bit stream order to the modulator.

Optionally the interleaver is configured to change a bit stream order of one LDPC code.

Optionally a code check matrix of the LDPC codes has one of the following structures, or a modified structure based upon one of the following structures: a lower-triangle matrix, a quasi-lower-triangle matrix, an upper-triangle matrix, or a quasi-upper-triangle matrix.

Optionally the changing, by the interleaver, the bit stream order of the LDPC codes according to the preset rule includes: changing, by the interleaver, first bit positions of codewords of a first part of bits in the LDPC codes to preset bit positions, and changing second bit positions of codewords of a second part of the bits in the LDPC codes randomly, where the preset bit positions are bit positions agreed on in advance with the receiver.

Optionally the codewords of the first part of the bits include codewords of punched bits.

An embodiment of the application provides a method for transmitting LDPC codes, the method including: receiving, by a demodulator, LDPC codes over a channel, and demodulating the LDPC codes, where the LDPC codes are LDPC codes in a bit stream order changed by an interleaver according to a preset rule; and resuming, by a de-interleaver, the bit stream order of the demodulated LDPC codes according to the preset rule.

Optionally after the resuming, by the de-interleaver, the bit stream order of the demodulated LDPC codes according to the preset rule, the method further includes: decoding, by a decoder, the LDPC codes in the resumed bit stream order.

Optionally the LDPC codes are incremental and redundant LDPC codes.

Optionally the de-interleaver includes N/C rows of block de-interleavers, and each row includes C columns of block de-interleaver, where N is the total number of codewords among the LDPC codes, the LDPC codes include N/C groups of codewords, and each group of codewords includes C bit codewords; and resuming, by the de-interleaver, the bit stream order of the demodulated LDPC codes according to the preset rule includes: receiving, by the de-interleaver, the respective groups of codewords among the demodulated LDPC codes in sequence in an order of the columns, outputting the codewords in sequence in an order of the rows, and obtaining and outputting the LDPC codes in the resumed bit stream order to the decoder.

Optionally the de-interleaver is configured to resume a bit stream order of one demodulated LDPC code.

Optionally a code check matrix of the LDPC codes has one of the following structures, or a modified structure based upon one of the following structures: a lower-triangle matrix, a quasi-lower-triangle matrix, an upper-triangle matrix, or a quasi-upper-triangle matrix.

Optionally the resuming, by the de-interleaver, the bit stream order of the demodulated LDPC codes according to the preset rule includes: resuming, by the de-interleaver, first bit positions of codewords of a first part of bits in the LDPC codes to preset bit positions, and resuming second bit positions of codewords of a second part of the bits in the LDPC codes randomly, where the preset bit positions are bit positions agreed on in advance with a receiver.

Optionally the codewords of the first part of the bits include codewords of punched bits.

An embodiment of the application provides an apparatus for transmitting LDPC codes, the apparatus including: an interleaver configured to change a bit stream order of LDPC codes according to a preset rule, and to output the LDPC codes in the changed bit stream order to a modulator; and the modulator configured to modulate the LDPC codes in the changed bit stream order, and then transmit them to a receiver over a channel.

Optionally the apparatus further includes an encoder configured to encode the LDPC codes, and to output the encoded LDPC codes to the interleaver before the interleaver changes the bit stream order of the LDPC codes according to the preset rule and outputs the LDPC codes in the changed bit stream order to the modulator; and the interleaver is configured: to change the bit stream order of the encoded LDPC codes according to the preset rule, and to output the LDPC codes in the changed bit stream order to the modulator.

Optionally the LDPC codes are incremental and redundant LDPC codes.

Optionally the interleaver includes N/C rows of block interleavers, and each row includes C columns of block interleavers, where N is the total number of codewords among the LDPC codes, the LDPC codes include N/C groups of codewords, and each group of codewords includes C bit codewords; and the interleaver is configured: to receive the respective groups of codewords in the LDPC codes in sequence in an order of the rows, to output the codewords in sequence in an order of the columns, and to obtain and output the LDPC codes in the changed bit stream order to the modulator.

Optionally the interleaver is configured to change a bit stream order of one LDPC code.

Optionally a code check matrix of the LDPC codes has one of the following structures, or a modified structure based upon one of the following structures: a lower-triangle matrix, a quasi-lower-triangle matrix, an upper-triangle matrix, or a quasi-upper-triangle matrix.

Optionally the interleaver configured to change the bit stream order of the LDPC codes according to the preset rule is configured: to change first bit positions of codewords of a first part of bits in the LDPC codes to preset bit positions, and to change second bit positions of codewords of a second part of the bits in the LDPC codes randomly, where the preset bit positions are bit positions agreed on in advance with the receiver.

Optionally the codewords of the first part of the bits include codewords of punched bits.

An embodiment of the application provides an apparatus for transmitting LDPC codes, the apparatus including: a demodulator configured to receive the LDPC codes over a channel, and to demodulate the LDPC codes, where the LDPC codes are LDPC codes in a bit stream order changed by an interleaver according to a preset rule; and a de-interleaver configured to resume the bit stream order of the demodulated LDPC codes according to the preset rule.

Optionally the apparatus further includes a decoder configured to decode the LDPC codes in the resumed bit stream order after the de-interleaver resumes the bit stream order of the demodulated LDPC codes according to the preset rule.

Optionally the LDPC codes are incremental and redundant LDPC codes.

Optionally the de-interleaver includes N/C rows of block de-interleavers, and each row includes C columns of block de-interleaver, where N is the total number of codewords among the LDPC codes, the LDPC codes include N/C groups of codewords, and each group of codewords includes C bit codewords; and the de-interleaver is configured: to receive the respective groups of codewords among the demodulated LDPC codes in sequence in an order of the columns, to output the codewords in sequence in an order of the rows, and to obtain and output the LDPC codes in the resumed bit stream order to the decoder.

Optionally the de-interleaver is configured to resume a bit stream order of one demodulated LDPC code.

Optionally a code check matrix of the LDPC codes has one of the following structures, or a modified structure based upon one of the following structures: a lower-triangle matrix, a quasi-lower-triangle matrix, an upper-triangle matrix, or a quasi-upper-triangle matrix.

Optionally the de-interleaver configured to resume the bit stream order of the demodulated LDPC codes according to the preset rule is configured: to resume first bit positions of codewords of a first part of bits in the LDPC codes to preset bit positions, and to resume second bit positions of codewords of a second part of the bits in the LDPC codes randomly, where the preset bit positions are bit positions agreed on in advance with a receiver.

Optionally the codewords of the first part of the bits include codewords of punched bits.

BRIEF DESCRIPTION OF THE DRAWINGS

In order to make the technical solutions according to the embodiments of the application more apparent, the drawings to which reference is to made in the description of the embodiments will be introduced below in brief, and apparently the drawings to be described below are only some embodiments of the application, and those ordinarily skilled in the art can further derive other drawings from these drawings without any inventive effort.

DETAILED DESCRIPTION OF THE EMBODIMENTS

The embodiments of the application provide a method and apparatus for transmitting low-density parity check codes so as to improve the robustness to a burst of errors while LDPC codes are being transmitted.

The embodiments of the application will be described by way of an example in which incremental and redundant LDPC codes are transmitted, but the technical solutions according to the embodiments of the application can also be applicable to transmission of all the other types of LDPC codes than the incremental and redundant LDPC codes.

The embodiments of the application provide a burst-of-errors-robust solution to transmitting incremental and redundant LDPC codes so as to improve the robustness of the incremental and redundant LDPC codes to a burst of errors while maintaining the original function of the incremental and redundant LDPC codes. Here the burst of errors refers to consecutive errors, that is, there are errors in transmission of a plurality of consecutive codewords among the incremental and redundant LDPC codes. The robustness to a burst of errors can refer to a capability to correct consecutive errors, i.e., to avoid errors in transmission of a plurality of consecutive codewords among the incremental and redundant LDPC codes. Also the embodiments of the application further provide an interleaver structure applicable to the solution to transmitting LDPC codes, and the interleaver structure can adapt to a varying code length of incremental and redundant LDPC codes to thereby implement the burst-of-errors-robust solution to transmitting incremental and redundant LDPC codes. Here the interleaver is a technical term. The interleaver changes an order of elements in an input sequence according to some rule, and then outputs the sequence in the changed order.

The highly burst-of-errors-robust solution to transmitting incremental and redundant LDPC codes according to the embodiments of the application will be introduced below.

Figure 3:
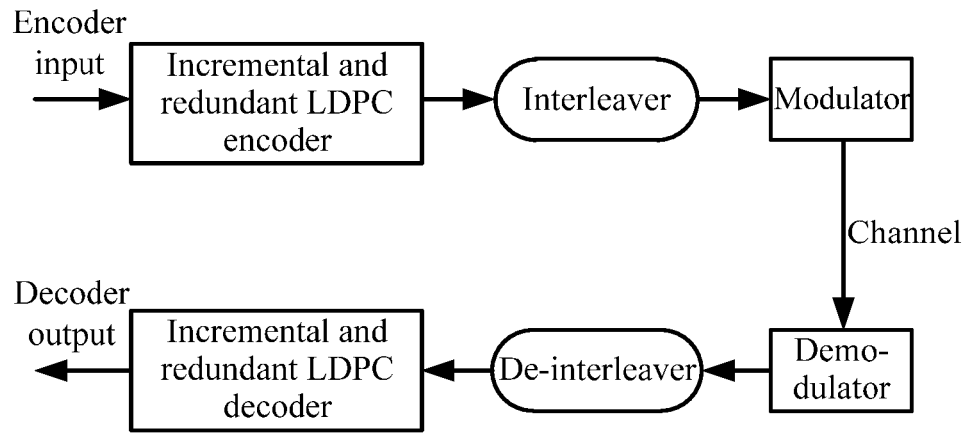
FIG. 3 is a schematic diagram of a solution to transmitting incremental and redundant LDPC codes according to an embodiment of the application.

FIG. 3 illustrates a burst-of-errors-robust solution to transmitting incremental and redundant LDPC codes according to an embodiment of the application. At least one difference from the other solutions to transmitting incremental and redundant LDPC codes is that, an interleaver and a de-interleaver are introduced to a process of transmitting incremental and redundant LDPC codes, where an information sequence input to an incremental and redundant LDPC encoder is encoded by the incremental and redundant LDPC encoder, so incremental and redundant LDPC codewords are output, and the incremental and redundant LDPC codewords are interleaved by the interleaver, and then modulated, transmitted over a channel, and demodulated, a demodulation result is de-interleaved by the de-interleaver, and finally it is decoded by an incremental and redundant LDPC decoder, so a decoding result is output. Here the "interleaved" operation changes an order of elements (i.e., the LDPC codewords in the embodiments of the application) in an input sequence according to some rule, and then outputs the sequence in the changed order. The interleaved object (i.e., the input sequence) are incremental and redundant LDPC codes, and the incremental and redundant LDPC codes are interleaved in a scheme as designed according to the embodiment of the application (i.e., a rule for changing a bit stream order of LDPC codes).

A design of the interleaver for incremental and redundant LDPC codes will be introduced below.

The interleaver is involved in the burst-of-errors-robust solution to transmitting incremental and redundant LDPC codes according to the embodiment of the application, and the interleaver is designed for a matrix structure of incremental and redundant LDPC codes according to the embodiment of the application.

Figure 4:
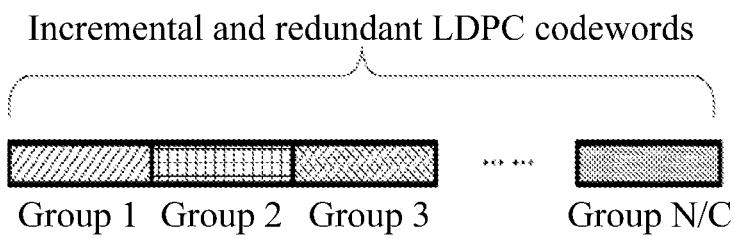
FIG. 4 is a schematic diagram of groups in incremental and redundant LDPC codewords according to an embodiment of the application.
Figure 5:
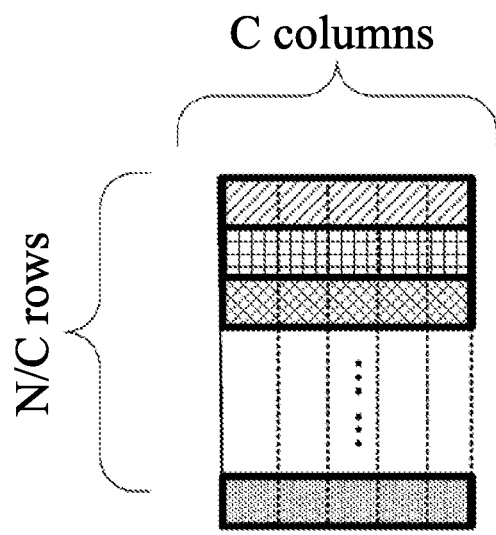
FIG. 5 is a schematic structural diagram of a block interleaver of N/C rows by C columns according to an embodiment of the application.

For incremental and redundant LDPC codes with a code rate R, a code length N, and a circulant permutation small matrix and a unit matrix with a size C, codewords thereof can be divided into N/C groups, and each group includes C bits, as illustrated in FIG. 4. An interleaver designed for the LDPC codes includes block interleavers of N/C rows by C columns, and an interleaving strategy thereof is "Row-Input and Column-Output" as illustrated in FIG. 5. The block interleavers are interleavers with a specific interleaving strategy "Row-Input and Column-Output", and as illustrated in FIG. 5 and FIG. 6, a particular interleaving flow thereof is as follows.

Figure 6:
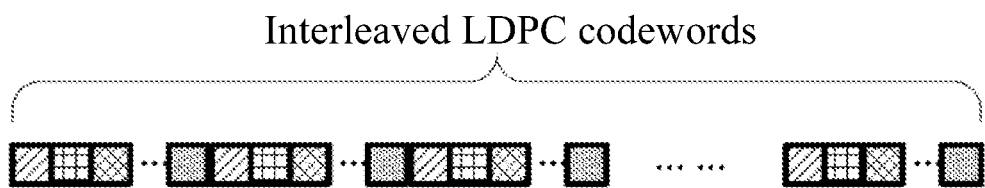
FIG. 6 is a schematic diagram of interleaved LDPC codewords according to an embodiment of the application.

Firstly the incremental and redundant LDPC codewords enter the respective rows of block interleavers in the interleaver as illustrated in FIG. 5 in sequence, where a row of block interleavers in the interleaver can be exactly filled up with a group of LDPC codewords; and after the entire interleaver is filled up with the LDPC codewords, the respective bits are output per column, thus resulting in the interleaved LDPC codewords as illustrated in FIG. 6, i.e., the LDPC codes in a changed bit stream order.

Figure 7:
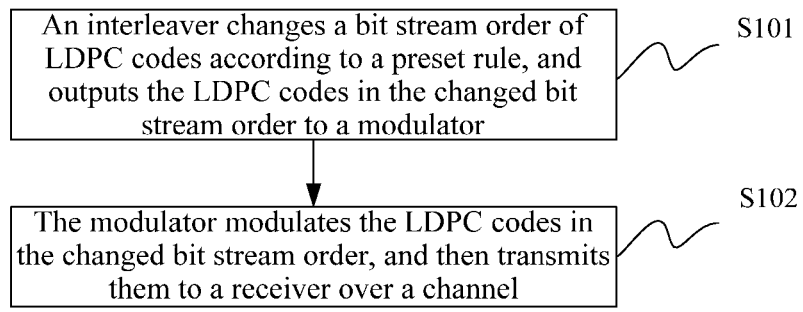
FIG. 7 is a schematic flow chart of a method for transmitting LDPC codes by a transmitter according to an embodiment of the application.

As can be apparent, referring to FIG. 7, a method for transmitting LDPC codes at a transmitter according to an embodiment of the application includes the following operations.

In the operation S101, an interleaver changes a bit stream order of LDPC codes according to a preset rule, and outputs the LDPC codes in the changed bit stream order to a modulator.

In the operation S102, the modulator modulates the LDPC codes in the changed bit stream order, and then transmits them to a receiver over a channel.

With this method, the interleaver changes the bit stream order of the LDPC codes according to the preset rule (e.g., Row-Input and Column-Output mentioned above, or Column-Input and Row-Output, etc.), and outputs the LDPC codes in the changed bit stream order to the modulator. The modulator modulates the LDPC codes in the changed bit stream order, and then transmits them to the receiver over the channel, thus lowering the probability of a burst of errors in a consecutive bit stream while the LDPC codes are being transmitted, so as to improve the robustness to a burst of errors while the LDPC codes are being transmitted.

Optionally before the interleaver changes the bit stream order of the LDPC codes according to the preset rule, and outputs the LDPC codes to the modulator, the method further includes: an encoder encodes the LDPC codes, and transmits the encoded LDPC codes to the interleaver; and the interleaver changes the bit stream order of the LDPC codes according to the preset rule, and outputs the LDPC codes in the changed bit stream order to the modulator particularly as follows: the interleaver changes the bit stream order of the encoded LDPC codes according to the preset rule, and outputs the LDPC codes in the changed bit stream order to the modulator.

Optionally the LDPC codes are incremental and redundant LDPC codes.

Furthermore a code check matrix of the incremental and redundant LDPC codes in the embodiment of the application has a partially determinative structure, e.g., a lower-triangle matrix, a quasi-lower-triangle matrix, an upper-triangle matrix, a quasi-upper-triangle matrix, or a matrix in a structure obtained by making some determinative modification thereto.

Figure 8:
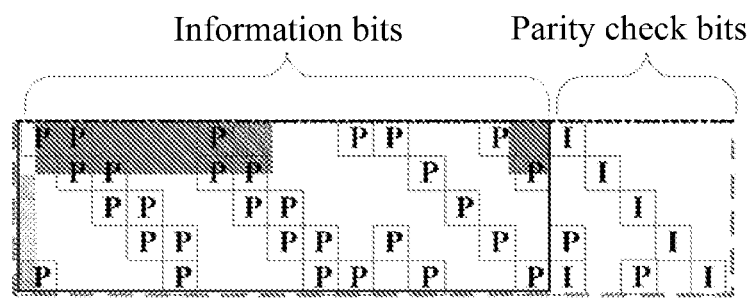
FIG. 8 is a schematic structural diagram of LDPC codes in a lower-triangle matrix structure according to an embodiment of the application.
Figure 9:
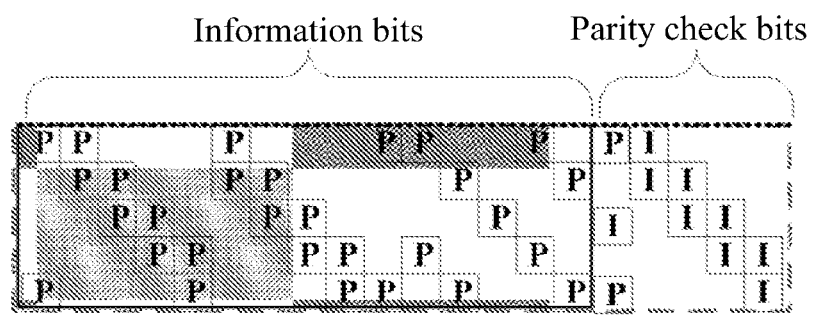
FIG. 9 is a schematic structural diagram of LDPC codes in a quasi-lower-triangle matrix structure according to an embodiment of the application.
Figure 10:
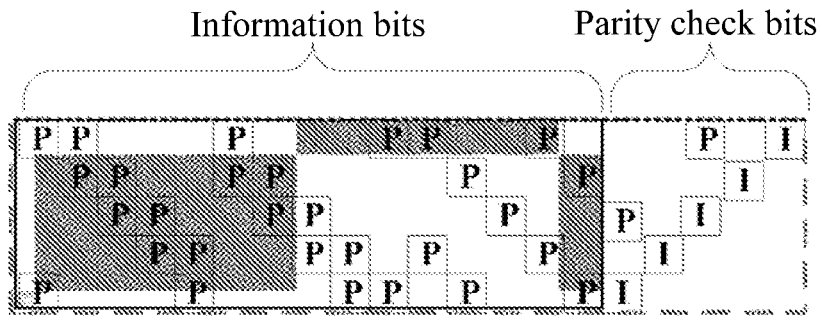
FIG. 10 is a schematic structural diagram of LDPC codes in an upper-triangle matrix structure according to an embodiment of the application.
Figure 11:
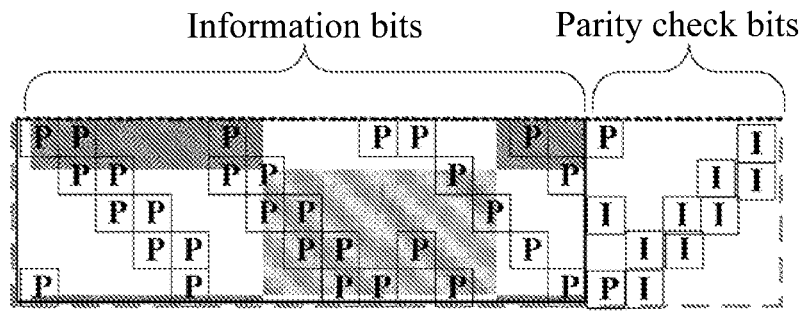
FIG. 11 is a schematic structural diagram of LDPC codes in a quasi-upper-triangle matrix structure according to an embodiment of the application.
Figure 12:
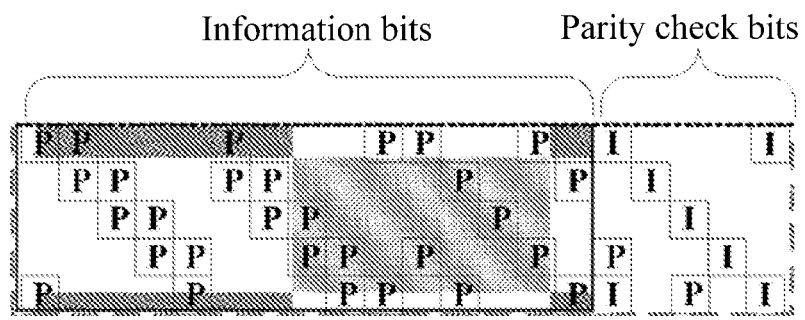
FIG. 12 is a schematic structural diagram of LDPC codes in a structure obtained by making determinative modification to the lower-triangle matrix structure according to an embodiment of the application.

Here FIG. 8 illustrates LDPC codes in a lower-triangle matrix structure, FIG. 9 illustrates LDPC codes in a quasi-lower-triangle matrix structure, FIG. 10 illustrates LDPC codes in an upper-triangle matrix structure, FIG. 11 illustrates LDPC codes in a quasi-upper-triangle matrix structure, and FIG. 12 illustrates LDPC codes in a structure obtained by making determinative modification to the lower-triangle matrix structure.

Figure 1:
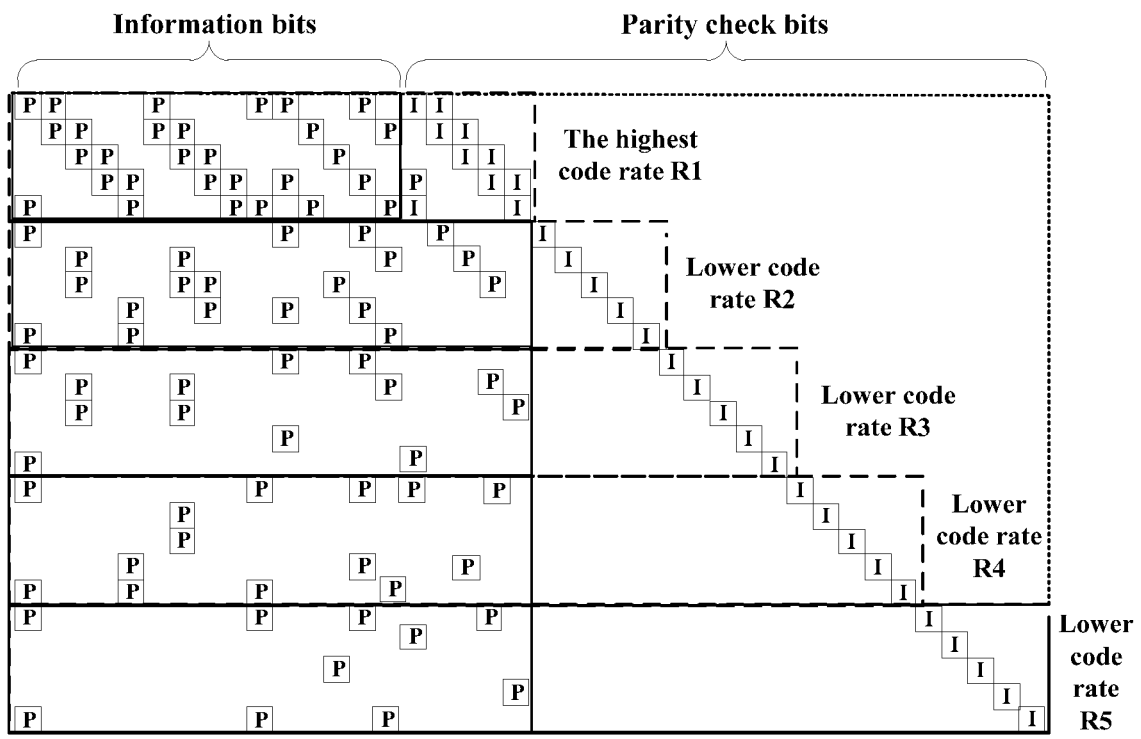
FIG. 1 is a schematic structural diagram of a check matrix of incremental and redundant LDPC codes in the related art.
Figure 2:
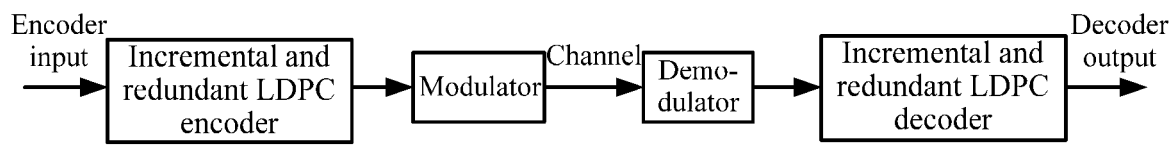
FIG. 2 is a schematic diagram of a solution to transmitting incremental and redundant LDPC codes in the related art.

In an embodiment of the application, the LDPC codes in the quasi-lower-triangle or lower-triangle structure are incremental and redundant LDPC codes with the highest code rate, and in another embodiment of the application, a parent-code structure thereof is as illustrated in FIG. 1, where the codewords of the highest code rate are in a dually-diagonal structure, for example, but they can alternatively be in a single-diagonal structure, although the embodiment of the application will not be limited thereto.

Optionally the interleaver includes N/C rows of block interleavers, and each row includes C columns of block interleavers, where N is the total number of codewords among the LDPC codes, the LDPC codes include N/C groups of codewords, and each group of codewords includes C bit codewords.

The interleaver changes a bit stream order of the LDPC codes according to the preset rule, and outputs the LDPC codes in the changed bit stream order to the modulator particularly as follows: the interleaver receives the respective groups of codewords in the LDPC codes in sequence in an order of the rows (e.g., in a top-to-bottom order of the rows, or in another preset order), outputs the codewords in sequence in an order of the columns (e.g., in a left-to-right order of the columns, or in another preset order), and obtains and outputs the LDPC codes in the changed bit stream order to the modulator.

Optionally the interleaver is configured to change a bit stream order of one LDPC code. Of course, the interleaver can alternatively be configured to interleave bit stream orders of a plurality of received LDPC codes, that is, the interleaver can simultaneously change the bit stream orders of the plurality of LDPC codes. If the interleaver is configured to change a bit stream order of only one LDPC code, then a delay in transmission of the LDPC codes may be shortened.

FIG. 8 to FIG. 11 only illustrate particular embodiments of a lower-triangle matrix, a quasi-lower-triangle matrix, an upper-triangle matrix, and a quasi-upper-triangle matrix respectively, but will not preclude other instances, e.g., a combination thereof, e.g., a matrix structure including an upper quasi-lower-triangle matrix and a lower lower-triangle matrix.

In these check matrixes as illustrated in FIG. 8 to FIG. 11, encoded bits corresponding to columns at some fixed positions are deleted (or punched, where these bits can be referred to as punched bits), that is, encoded bits corresponding to some columns in the check matrix are not fed to the channel, and thus do not occupy any transmission time-frequency resources; and although the punched bits are encoded bits, they correspond to the columns in the check matrix in a one-to-one manner, so these columns can be referred to as fixed punched columns in the check matrix.

Figure 13:
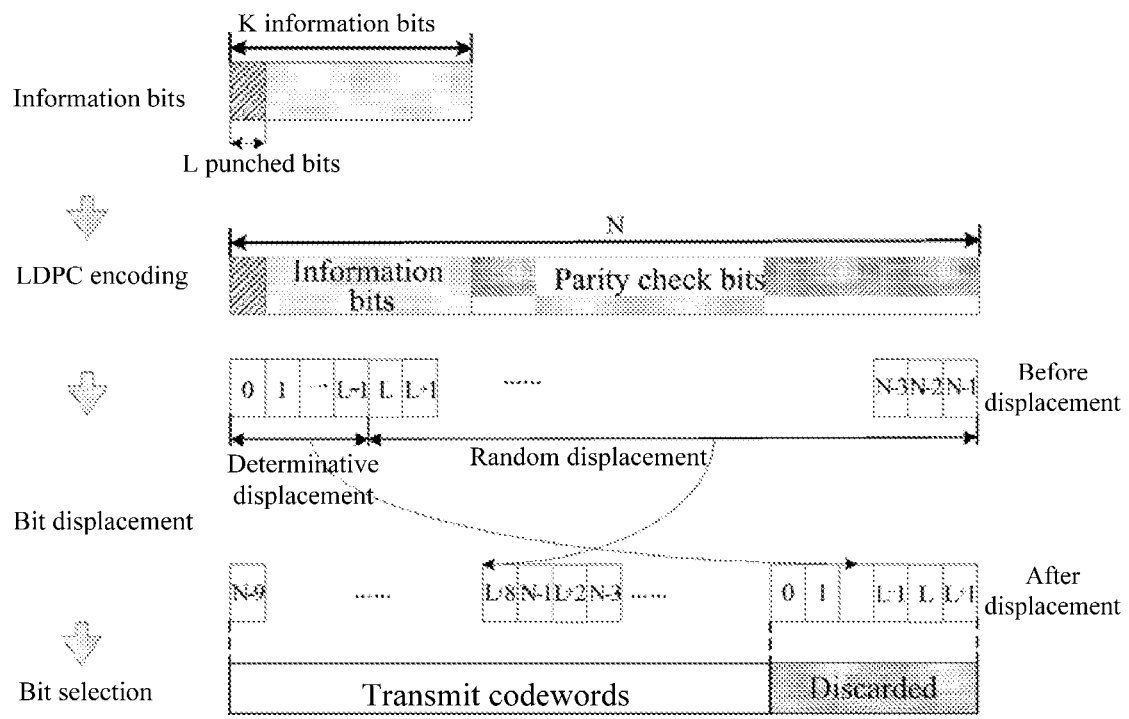
FIG. 13 is a schematic diagram of changing a bit stream order of LDPC codes according to an embodiment of the application.

Both the number and the positions of the fixed punched columns in the check matrix are fixed, and the positions of these columns may lie in the very front of the matrix, or be some positions at the middle of the matrix, and may or may not be consecutive; or in another implementation, the punched bits correspond to fixed punched columns in the check matrix, which are known to both an eNB and a UE (or a transmitter and a receiver), or which may be signaled. In this situation, as a special example of intra-block interleaving of the LDPC check matrix, the encoded bits corresponding to the fixed punched columns in the encoded check matrix can be replaced into determinative positions, and the remaining encoded bits can be replaced randomly, particularly as illustrated in FIG. 13.

Without any loss of generality, if the number of information bits is K, and the information bits are LDPC-encoded into an N-bit codeword, then the first L bits among the K bits will be punched bits, so the first L columns on the check matrix will be fixed punched columns. FIG. 13 only illustrates the positions of the punched bits by way of an example, but these L bits may be located at any positions among the parity check bits of the codeword. In an intra-codeword replacing process, the punched bits are replaced determinatively so that the positions of the replaced bits are fixed positions. FIG. 13 illustrates the determinatively replaced bits placed consecutively at the very tail of a new sequence for the sake of a convenient illustration, but the embodiment of the application will not be limited thereto. In another implementation, the determinative positions can be agreed on in advance between an eNB and a UE. The other encoded bits than the punched bits are replaced randomly to obtain codewords to be transmitted, and the codewords are transmitted to a channel.

It shall be noted that an object to be replaced in this example is the punched bits, but can alternatively be other bits, e.g., zero padding bits, truncated bits, or other bits which are not transmitted to the channel, but intra-codeword interleaving involves determinative displacement in position, and random displacement in position. In fact, the truncated bits are also 0 bits, and different from the zero padding bits in that: the columns in the check matrix, which correspond to the zero padding bits are decoded more complexly, and the columns in the check matrix, which correspond to the truncated bits are not decoded, with low complexity but poor performance. These bits which are not transmitted to the channel are known in advance to the eNB and the UE.

Accordingly optionally the interleaver changes the bit stream order of the LDPC codes according to the preset rule as follows: the interleaver changes first bit positions of codewords of a first part of bits in the LDPC codes to preset bit positions, and changes second bit positions of codewords of a second part of the bits in the LDPC codes randomly, where the preset bit positions are bit positions agreed on in advance with the receiver.

Optionally the codewords of the first part of the bits include codewords of punched bits.

Figure 14:
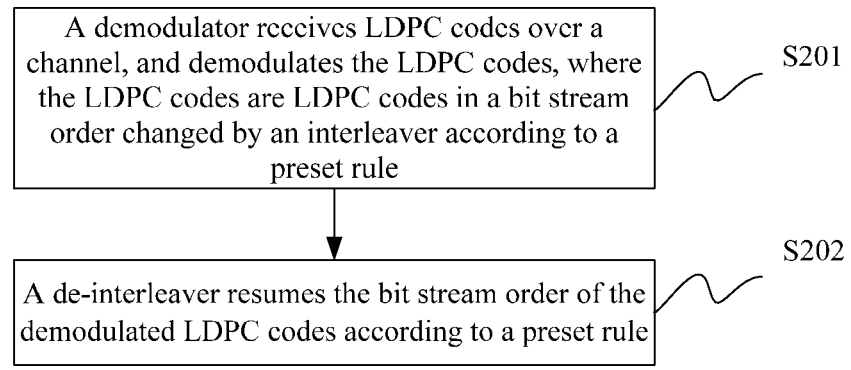
FIG. 14 is a schematic flow chart of a method for transmitting LDPC codes by a receiver according to an embodiment of the application.

Correspondingly referring to FIG. 14, a method for transmitting LDPC codes at a receiver according to an embodiment of the application includes the following operations.

In the operation S201, a demodulator receives LDPC codes over a channel, and demodulates the LDPC codes, where the LDPC codes are LDPC codes in a bit stream order changed by an interleaver according to a preset rule.

In the operation S202, a de-interleaver resumes the bit stream order of the demodulated LDPC codes according to the preset rule.

Here the de-interleaving rule of the de-interleaver of the receiver corresponds to the interleaving rule of the interleaver of a transmitter, or an operation of the de-interleaver to resumes the bit stream order of the demodulated LDPC codes according to the preset rule is inverse to an operation of the interleaver to change the bit stream order of the LDPC codes according to the preset rule.

Optionally after the de-interleaver resumes the bit stream order of the demodulated LDPC codes according to the preset rule, the method further includes: a decoder decodes the LDPC codes in the resumed bit stream order.

Optionally the LDPC codes are incremental and redundant LDPC codes.

Optionally the de-interleaver includes N/C rows of block de-interleavers, and each row includes C columns of block de-interleaver, where N is the total number of codewords among the LDPC codes, the LDPC codes include N/C groups of codewords, and each group of codewords includes C bit codewords.

The de-interleaver resumes the bit stream order of the demodulated LDPC codes according to the preset rule as follows: the de-interleaver receives the respective groups of codewords among the demodulated LDPC codes in sequence in an order of the columns, outputs the codewords in sequence in an order of the rows, and obtains and outputs the LDPC codes in the resumed bit stream order to the decoder.

Of course, the particular orders in which the de-interleaver receives the codewords and outputs the codewords are determined by the particular interleaving rule of the interleaver of the transmitter as long as the bit stream order of the LDPC codes is resumed, that is, the bit stream order of the LDPC codes is changed to the original consecutive bit stream order.

Optionally the de-interleaver is configured to resume a bit stream order of one demodulated LDPC code.

Figure 15:
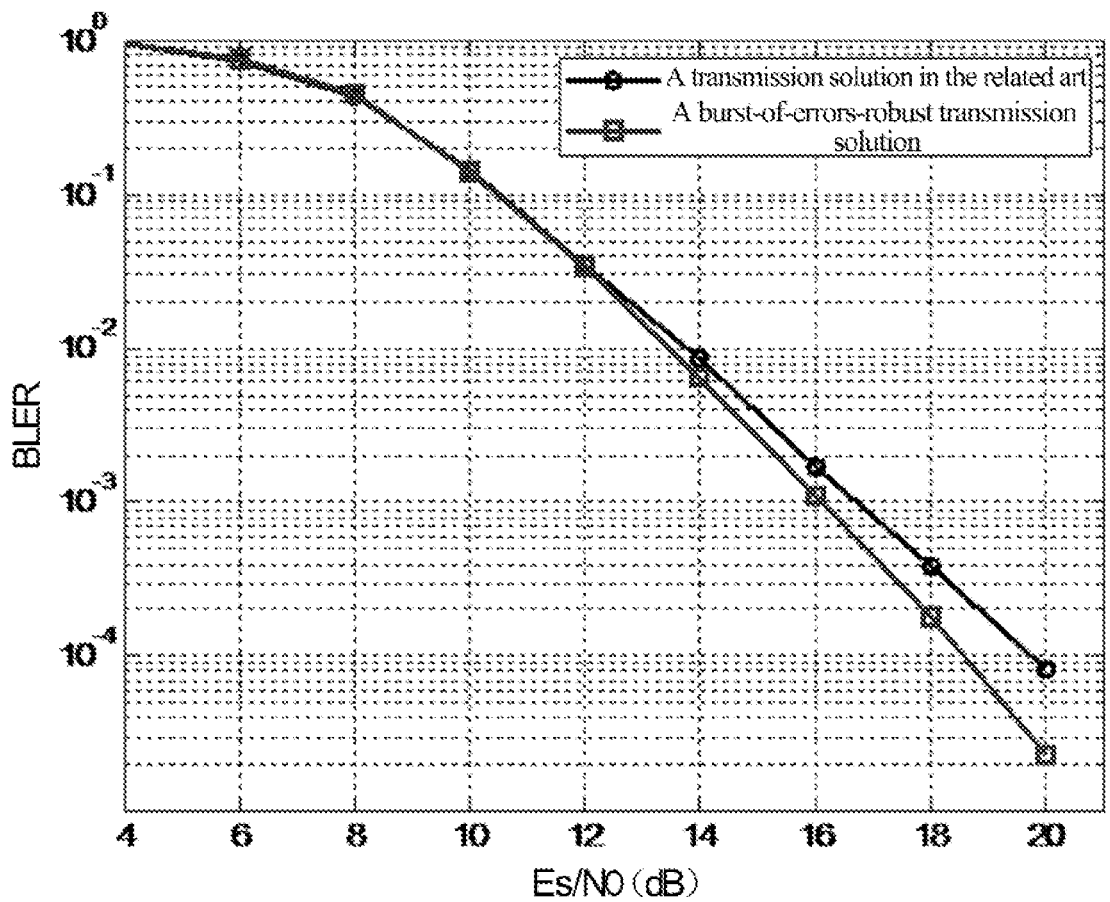
FIG. 15 is a schematic diagram of comparing simulation results of the solution to transmitting LDPC codes according to the embodiment of the application, and the other solutions to transmitting LDPC codes.

The effectiveness of the transmission solution according to the embodiment of the application can be demonstrated in the following simulation example, where Table 2 depicts simulation parameters, and FIG. 15 illustrates a simulation result. As can be apparent from the simulation result curves in FIG. 15, comparing the burst-of-errors-robust solution to transmitting incremental and redundant LDPC codes according to the embodiment of the application with the other solutions to transmitting LDPC codes, there is a performance gain of approximately 1 dB at a BLock Error Rate (BLER) $10^{-4}$ in the burst-of-errors-robust solution to transmitting incremental and redundant LDPC codes.

TABLE 2

| | Simulation parameters | | | | |
| --- | --- | --- | --- | --- | --- |
| LDPC | The length K of information bits | Code rate R | Decoder | Channel | Modulation |
| Quasi-cyclic Irregular Repeat | 432 | 3/4 | Belief Propagation (BP) | Related fading channel with | Quadrature Amplitude |

TABLE 2-continued

Simulation parameters

| LDPC | The length K of information bits | Code rate R | Decoder | Channel | Modulation |
|---|---|---|---|---|---|
| Accumulate (QC-IRA) LDPC | | | decoder with at most 50 iterations | FdTs = 0.01 | Modulation (QAM) |
| QC-IRA LDPC | 432 | 3/4 | BP decoder with at most 50 iterations | Related fading channel with FdTs = 0.01 | QAM |

In the technical solution according to the embodiment above of the application, firstly the burst-of-errors-robust solution to transmitting incremental and redundant LDPC codes is described, and for incremental and redundant LDPC codes, the interleaver and the de-interleaver shall be introduced to improve the robustness to a burst of errors.

Furthermore in the technical solution according to the embodiment above of the application, the interleaver design for incremental and redundant LDPC codes is further described, and for incremental and redundant LDPC codes, codewords thereof can be divided into N/C groups, and each group includes C bits. The interleaver designed for the LDPC codes includes block interleavers of N/C rows by C columns, and an interleaving strategy thereof is "Row-Input and Column-Output". Correspondingly the de-interleaving strategy of the de-interleaver of the receiver is "Column-Input and Row-Output".

Accordingly the embodiments of the application provide a burst-of-errors-robust solution to transmitting incremental and redundant LDPC codes so as to improve the robustness of the incremental and redundant to a burst of errors while maintaining the original function of the incremental and redundant LDPC codes. Also the embodiments of the application further provide a special interleaver structure, and the interleaver structure can adapt to a varying code length of incremental and redundant LDPC codes to thereby implement efficiently the burst-of-errors-robust solution to transmitting incremental and redundant LDPC codes.

Figure 16:
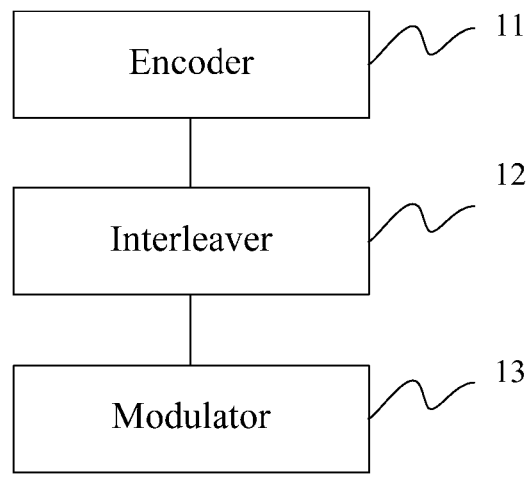
FIG. 16 is a schematic structural diagram of an apparatus for transmitting LDPC codes by a transmitter according to an embodiment of the application.

Based upon the same inventive idea as the method above at the transmitter, referring to FIG. 16, an apparatus for transmitting LDPC codes at a transmitter according to an embodiment of the application includes: an interleaver 12 is configured to change a bit stream order of the LDPC codes according to a preset rule, and to output the LDPC codes in the changed bit stream order to a modulator; and the modulator 13 is configured to modulate the LDPC codes in the changed bit stream order, and then transmit them to a receiver over a channel.

Optionally the apparatus further includes an encoder 11 configured to encode the LDPC codes, and to output the encoded LDPC codes to the interleaver before the interleaver changes the bit stream order of the LDPC codes according to the preset rule and outputs the LDPC codes in the changed bit stream order to the modulator; and the interleaver is configured: to change the bit stream order of the encoded LDPC codes according to the preset rule, and to output the LDPC codes in the changed bit stream order to the modulator.

Optionally the LDPC codes are incremental and redundant LDPC codes.

Optionally the interleaver includes N/C rows of block interleavers, and each row includes C columns of block interleavers, where N is the total number of codewords among the LDPC codes, the LDPC codes include N/C groups of codewords, and each group of codewords includes C bit codewords; and the interleaver is configured: to receive the respective groups of codewords in the LDPC codes in sequence in an order of the rows, to output the codewords in sequence in an order of the columns, and to obtain and output the LDPC codes in the changed bit stream order to the modulator.

Optionally the interleaver is configured to change a bit stream order of one LDPC code.

Figure 17:
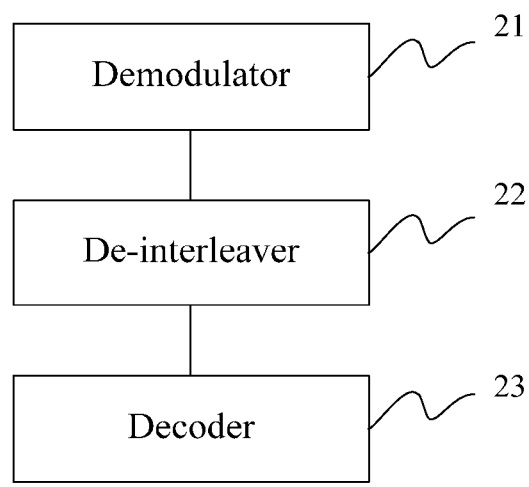
FIG. 17 is a schematic structural diagram of an apparatus for transmitting LDPC codes by a receiver according to an embodiment of the application.

Correspondingly referring to FIG. 17, an apparatus for transmitting LDPC codes at a receiver according to an embodiment of the application includes: a demodulator 21 is configured to receive the LDPC codes over a channel, and to demodulate the LDPC codes, where the LDPC codes are LDPC codes in a bit stream order changed by an interleaver according to a preset rule; and a de-interleaver 22 is configured to resume the bit stream order of the demodulated LDPC codes according to the preset rule.

Optionally the apparatus further includes a decoder 23 configured to decode the LDPC codes in the resumed bit stream order after the de-interleaver resumes the bit stream order of the demodulated LDPC codes according to the preset rule.

Optionally the LDPC codes are incremental and redundant LDPC codes.

Optionally the de-interleaver includes N/C rows of block de-interleavers, and each row includes C columns of block de-interleaver, where N is the total number of codewords among the LDPC codes, the LDPC codes include N/C groups of codewords, and each group of codewords includes C bit codewords; and the de-interleaver is configured: to receive the respective groups of codewords among the demodulated LDPC codes in sequence in an order of the columns, to output the codewords in sequence in an order of the rows, and to obtain and output the LDPC codes in the resumed bit stream order to the decoder.

Optionally the de-interleaver is configured to resume a bit stream order of one demodulated LDPC code.

In summary, the embodiments of the application provides a burst-of-errors-robust solution to transmitting incremental and redundant LDPC codes, and for incremental and redundant LDPC codes, the interleaver is arranged between the encoder and the modulator, and the de-interleaver is arranged between the demodulator and the decoder, so this solution can improve the robustness of the incremental and redundant LDPC codes to a burst of errors while maintaining the original function of the incremental and redundant LDPC codes.

Also the embodiments of the application further provide a special interleaver structure, i.e., the block-interleaver structure as illustrated in FIG. 5, and since the row and column parameters in the block-interleaver structure in FIG.

5 are selected, the block-interleaver structure can adapt to a varying code length of incremental and redundant LDPC codes to thereby implement efficiently the burst-of-errors-robust solution to transmitting incremental and redundant LDPC codes.

Those skilled in the art shall appreciate that the embodiments of the application can be embodied as a method, a system or a computer program product. Therefore the application can be embodied in the form of an all-hardware embodiment, an all-software embodiment or an embodiment of software and hardware in combination. Furthermore the application can be embodied in the form of a computer program product embodied in one or more computer useable storage mediums (including but not limited to a disk memory, an optical memory, etc.) in which computer useable program codes are contained.

The application has been described in a flow chart and/or a block diagram of the method, the device (system) and the computer program product according to the embodiments of the application. It shall be appreciated that respective flows and/or blocks in the flow chart and/or the block diagram and combinations of the flows and/or the blocks in the flow chart and/or the block diagram can be embodied in computer program instructions. These computer program instructions can be loaded onto a general-purpose computer, a specific-purpose computer, an embedded processor or a processor of another programmable data processing device to produce a machine so that the instructions executed on the computer or the processor of the other programmable data processing device create means for performing the functions specified in the flow(s) of the flow chart and/or the block(s) of the block diagram.

These computer program instructions can also be stored into a computer readable memory capable of directing the computer or the other programmable data processing device to operate in a specific manner, so that the instructions stored in the computer readable memory create an article of manufacture including instruction means which perform the functions specified in the flow(s) of the flow chart and/or the block(s) of the block diagram.

These computer program instructions can also be loaded onto the computer or the other programmable data processing device so that a series of operational operations are performed on the computer or the other programmable data processing device to create a computer implemented process so that the instructions executed on the computer or the other programmable device provide operations for performing the functions specified in the flow(s) of the flow chart and/or the block(s) of the block diagram.

Evidently those skilled in the art can make various modifications and variations to the application without departing from the spirit and scope of the application. Thus the application is also intended to encompass these modifications and variations thereto so long as the modifications and variations come into the scope of the claims appended to the application and their equivalents.

The invention claimed is:

1. A method for transmitting Low-Density Parity Check (LDPC) codes, the method comprising:
    changing, by an interleaver, a bit stream order of LDPC codes according to a preset rule, and outputting the LDPC codes in the changed bit stream order to a modulator; and
    modulating, by the modulator, the LDPC codes in the changed bit stream order, and then transmitting them to a receiver over a channel;
    wherein the changing, by the interleaver, the bit stream order of the LDPC codes according to the preset rule comprises:
    changing, by the interleaver, first bit positions of codewords of a first part of bits in the LDPC codes to preset bit positions, and changing second bit positions of codewords of a second part of the bits in the LDPC codes randomly, wherein the preset bit positions are bit positions agreed on in advance with the receiver;
    wherein the codewords of the first part of the bits comprise codewords of punched bits.

2. The method according to claim 1, wherein before changing, by the interleaver, the bit stream order of the LDPC codes according to the preset rule, and outputting the LDPC codes in the changed bit stream order to the modulator, the method further comprises: encoding, by an encoder, the LDPC codes, and outputting the encoded LDPC codes to the interleaver; and
    the changing, by the interleaver, the bit stream order of the LDPC codes according to the preset rule, and outputting the LDPC codes in the changed bit stream order to the modulator comprises:
    changing, by the interleaver, the bit stream order of the encoded LDPC codes according to the preset rule, and outputting the LDPC codes in the changed bit stream order to the modulator.

3. The method according to claim 1, wherein the interleaver comprises N/C rows of block interleavers, and each row comprises C columns of block interleavers, wherein N is a total quantity of codewords among the LDPC codes, the LDPC codes comprise N/C groups of codewords, and each group of codewords comprises C bit codewords; and
    the changing, by the interleaver, the bit stream order of the LDPC codes according to the preset rule, and outputting the LDPC codes in the changed bit stream order to the modulator comprises:
    receiving, by the interleaver, the respective groups of codewords in the LDPC codes in sequence in an order of the rows, outputting the codewords in sequence in an order of the columns, and obtaining and outputting the LDPC codes in the changed bit stream order to the modulator.

4. The method according to claim 1, wherein a code check matrix of the LDPC codes has one of the following structures, or a modified structure based upon one of the following structures: a lower-triangle matrix, a quasi-lower-triangle matrix, an upper-triangle matrix, or a quasi-upper-triangle matrix.

5. A method for transmitting Low-Density Parity Check (LDPC) codes, the method comprising:
    receiving, by a demodulator, LDPC codes over a channel, and demodulating the LDPC codes, wherein the LDPC codes are LDPC codes in a bit stream order changed by an interleaver according to a preset rule; and
    resuming, by a de-interleaver, the bit stream order of the demodulated LDPC codes according to the preset rule;
    wherein the resuming, by the de-interleaver, the bit stream order of the demodulated LDPC codes according to the preset rule comprises:
    resuming, by the de-interleaver, first bit positions of codewords of a first part of bits in the LDPC codes to preset bit positions, and resuming second bit positions of codewords of a second part of the bits in the LDPC codes randomly, wherein the preset bit positions are bit positions agreed on in advance with a receiver;
    wherein the codewords of the first part of the bits comprise codewords of punched bits.

6. The method according to claim 5, wherein after the resuming, by the de-interleaver, the bit stream order of the demodulated LDPC codes according to the preset rule, the method further comprises: decoding, by a decoder, the LDPC codes in the resumed bit stream order.

7. The method according to claim 5, wherein the de-interleaver comprises N/C rows of block de-interleavers, and each row comprises C columns of block de-interleaver, wherein N is a total quantity of codewords among the LDPC codes, the LDPC codes comprise N/C groups of codewords, and each group of codewords comprises C bit codewords; and the resuming, by the de-interleaver, the bit stream order of the demodulated LDPC codes according to the preset rule comprises:

receiving, by the de-interleaver, the respective groups of codewords among the demodulated LDPC codes in sequence in an order of the columns, outputting the codewords in sequence in an order of the rows, and obtaining and outputting the LDPC codes in the resumed bit stream order to the decoder.

8. The method according to claim 5, wherein a code check matrix of the LDPC codes has one of the following structures, or a modified structure based upon one of the following structures: a lower-triangle matrix, a quasi-lower-triangle matrix, an upper-triangle matrix, or a quasi-upper-triangle matrix.

9. An apparatus for transmitting Low-Density Parity Check (LDPC) codes, the apparatus comprising:

an interleaver configured to change a bit stream order of LDPC codes according to a preset rule, and to output the LDPC codes in the changed bit stream order to a modulator; and the modulator configured to modulate the LDPC codes in the changed bit stream order, and then transmit them to a receiver over a channel;

wherein the interleaver configured to change the bit stream order of the LDPC codes according to the preset rule is configured:

to change first bit positions of codewords of a first part of bits in the LDPC codes to preset bit positions, and to change second bit positions of codewords of a second part of the bits in the LDPC codes randomly, wherein the preset bit positions are bit positions agreed on in advance with the receiver;

wherein the codewords of the first part of the bits comprise codewords of punched bits.

10. The apparatus according to claim 9, wherein the apparatus further comprises an encoder configured to encode the LDPC codes, and to output the encoded LDPC codes to the interleaver before the interleaver changes the bit stream order of the LDPC codes according to the preset rule and outputs the LDPC codes in the changed bit stream order to the modulator; and the interleaver is configured: to change the bit stream order of the encoded LDPC codes according to the preset rule, and to output the LDPC codes in the changed bit stream order to the modulator.

11. The apparatus according to claim 9, wherein the interleaver comprises N/C rows of block interleavers, and each row comprises C columns of block interleavers, wherein N is a total quantity of codewords among the LDPC codes, the LDPC codes comprise N/C groups of codewords, and each group of codewords comprises C bit codewords; and the interleaver is configured: to receive the respective groups of codewords in the LDPC codes in sequence in an order of the rows, to output the codewords in sequence in an order of the columns, and to obtain and output the LDPC codes in the changed bit stream order to the modulator.

12. The apparatus according to claim 9, wherein a code check matrix of the LDPC codes has one of the following structures, or a modified structure based upon one of the following structures: a lower-triangle matrix, a quasi-lower-triangle matrix, an upper-triangle matrix, or a quasi-upper-triangle matrix.

13. An apparatus for transmitting Low-Density Parity Check (LDPC) codes, the apparatus comprising:

a demodulator configured to receive the LDPC codes over a channel, and to demodulate the LDPC codes, wherein the LDPC codes are LDPC codes in a bit stream order changed by an interleaver according to a preset rule; and a de-interleaver configured to resume the bit stream order of the demodulated LDPC codes according to the preset rule;

wherein the de-interleaver configured to resume the bit stream order of the demodulated LDPC codes according to the preset rule is configured:

to resume first bit positions of codewords of a first part of bits in the LDPC codes to preset bit positions, and to resume second bit positions of codewords of a second part of the bits in the LDPC codes randomly, wherein the preset bit positions are bit positions agreed on in advance with a receiver;

wherein the codewords of the first part of the bits comprise codewords of punched bits.

14. The apparatus according to claim 13, wherein the apparatus further comprises a decoder configured to decode the LDPC codes in the resumed bit stream order after the de-interleaver resumes the bit stream order of the demodulated LDPC codes according to the preset rule.

15. The apparatus according to claim 13, wherein the de-interleaver comprises N/C rows of block de-interleavers, and each row comprises C columns of block de-interleaver, wherein N is a total quantity of codewords among the LDPC codes, the LDPC codes comprise N/C groups of codewords, and each group of codewords comprises C bit codewords; and the de-interleaver is configured: to receive the respective groups of codewords among the demodulated LDPC codes in sequence in an order of the columns, to output the codewords in sequence in an order of the rows, and to obtain and output the LDPC codes in the resumed bit stream order to the decoder.

16. The apparatus according to claim 13, wherein a code check matrix of the LDPC codes has one of the following structures, or a modified structure based upon one of the following structures: a lower-triangle matrix, a quasi-lower-triangle matrix, an upper-triangle matrix, or a quasi-upper-triangle matrix.

\* \* \* \* \*